(12) United States Patent
Chung-Zen

(10) Patent No.: US 7,271,063 B2
(45) Date of Patent: Sep. 18, 2007

(54) METHOD OF FORMING FLASH CELL ARRAY HAVING REDUCED WORD LINE PITCH

(75) Inventor: Chen Chung-Zen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 91 days.

(21) Appl. No.: 11/250,800

(22) Filed: Oct. 13, 2005

(65) Prior Publication Data

US 2007/0087502 A1    Apr. 19, 2007

(51) Int. Cl.
    *H01L 21/336* (2006.01)
(52) U.S. Cl. ............ 438/257; 438/238; 438/381; 257/E21.17; 257/E21.218; 257/E21.245; 257/E21.645
(58) Field of Classification Search ............. 438/381, 438/238, 257, 289, 365, 369, 513, 680
    See application file for complete search history.

(56) References Cited

U.S. PATENT DOCUMENTS

| | | | |
|---|---|---|---|
| 4,939,690 A | | 7/1990 | Momodomi et al. |
| 5,050,125 A | | 9/1991 | Momodomi et al. |
| 5,482,881 A | * | 1/1996 | Chen et al. ............. 438/264 |
| 5,631,179 A | * | 5/1997 | Sung et al. ............. 438/264 |
| 5,891,774 A | * | 4/1999 | Ueda et al. ............. 438/264 |
| 5,990,509 A | * | 11/1999 | Burns et al. ............ 257/296 |
| 6,580,120 B2 | * | 6/2003 | Haspeslagh ............. 257/315 |
| 6,714,457 B1 | | 3/2004 | Hsu et al. |
| 6,765,261 B2 | | 7/2004 | Widdershoven |
| 6,774,433 B2 | * | 8/2004 | Lee et al. .............. 257/326 |
| 6,806,143 B2 | * | 10/2004 | Chen .................... 438/278 |
| 2001/0024854 A1 | | 9/2001 | Takeuchi et al. |
| 2006/0022276 A1 | * | 2/2006 | Park et al. ............. 257/368 |

OTHER PUBLICATIONS

Park, Jong-Ho et al., 8Gb MLC (Multi-Level Cell) NAND Flash Memory using 63nm Process Technology, 0-7803-8684-1/04, © 2004 IEEE, pp. 36.1.1-36.1.4.

Lee, June et al., High-Performance 1-Gb NAND Flash Memory With 0.12-um Technology 0018-920/02 © 2002 IEEE, pp. 1502-1509.

Kamins, Theodore I., "Effect of Polysilicon-Emitter Shape on Dopant Diffusion in Polysilicon-Emitter Transistors," 0741-3106/89/900/0401 © 1989 IEEE, 4 pages.

* cited by examiner

*Primary Examiner*—David Nhu
(74) *Attorney, Agent, or Firm*—Duane Morris LLP

(57) ABSTRACT

A method of forming a NAND Flash memory device includes forming a control gate polysilicon layer over a substrate, forming a mask layer over the control gate polysilicon layer, the mask layer including a mask pattern defining a plurality of spaced word lines of the FLASH memory device, the word lines being spaced from each other a distance less than a minimum feature size which can be imaged by a selected photolithography process used in forming at least a portion of the mask layer pattern, and etching the control gate polysilicon layer through the mask layer.

22 Claims, 7 Drawing Sheets

US 7,271,063 B2

METHOD OF FORMING FLASH CELL ARRAY HAVING REDUCED WORD LINE PITCH

FIELD OF THE INVENTION

The present invention generally relates to FLASH memory devices and methods of making the same.

BACKGROUND OF THE INVENTION

NAND type EEPROMs (Electrically Erasable Programmable Read Only Memories) or flash memories have been developed for solid-state mass storage applications for portable music players, mobile telephones, digital cameras, and the like, as well as have been considered as a replacement for hard disk drives (HDDs). It is therefore desired that these device have larger capacities, lower cost, and reduced cell size for miniaturization and increased processing speed.

NAND device structures are typically designed such that: (1) each memory cell utilizes one transistor having a floating gate and a control gate; and (2) a single contact is provided between an array of memory cells arranged on a substrate to and a corresponding bit line. Therefore, as compared with the conventional EEPROM, the area occupied by memory cells is reduced and integration density can be improved, although cell spacing is typically limited by the selected photolithography process.

U.S. Pat. No. 5,050,125 (the '125 patent) discloses a non-volatile semiconductor memory where each bit line comprises a series array of FLASH memory cells (shown in the cross-sectional view of FIG. 4 of the '125 patent). Cell size or area is defined by the width of the floating gate and adjacent insulating region (X-direction of FIG. 4) and by the width of the associated control gate and adjacent insulating region (in the Y-direction), i.e., the overlapping area needed for the floating gate and control gates. The cell size of each cell of the '125 patent cannot be reduced beyond about $4F^2$-$5F^2$, where "F" is the minimum dimension which can be imaged photolithographically, i.e., the minimum feature size or line width obtainable by a lithography technique used in the manufacturing process of the '125 patent. This minimum feature size is believed to be currently about 90 nm. This conclusion assumes that the minimum width of the floating gate is about 1F and the minimum width of the spacing between adjacent floating gates in an array of floating gates is also about 1F, while the minimum width of the control gate is about 1F and the minimum spacing between adjacent control gates is about 1F, meaning each cell occupies at least a minimum of 2F in the X-direction and 2F to 2.5F in the Y-direction.

A device having a reduced word line pitch is proposed in U.S. Pat. No. 6,580,120 to Haspeslagh, but utilizing a complex multi-group world line formation process.

It would be desirable, therefore, to increase the integration density of FLASH memory arrays while utilizing a process that can be readily integrated.

SUMMARY OF THE INVENTION

A method of forming a NAND Flash memory device comprises forming a control gate polysilicon layer over a substrate, forming a mask layer over the control gate polysilicon layer, the mask layer including a mask pattern defining a plurality of spaced word lines of the FLASH memory device, the word lines being spaced from each other a distance less than a minimum feature size which can be imaged by a selected photolithography process used in forming at least a portion of the mask layer pattern, and etching the control gate polysilicon layer through the mask layer.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
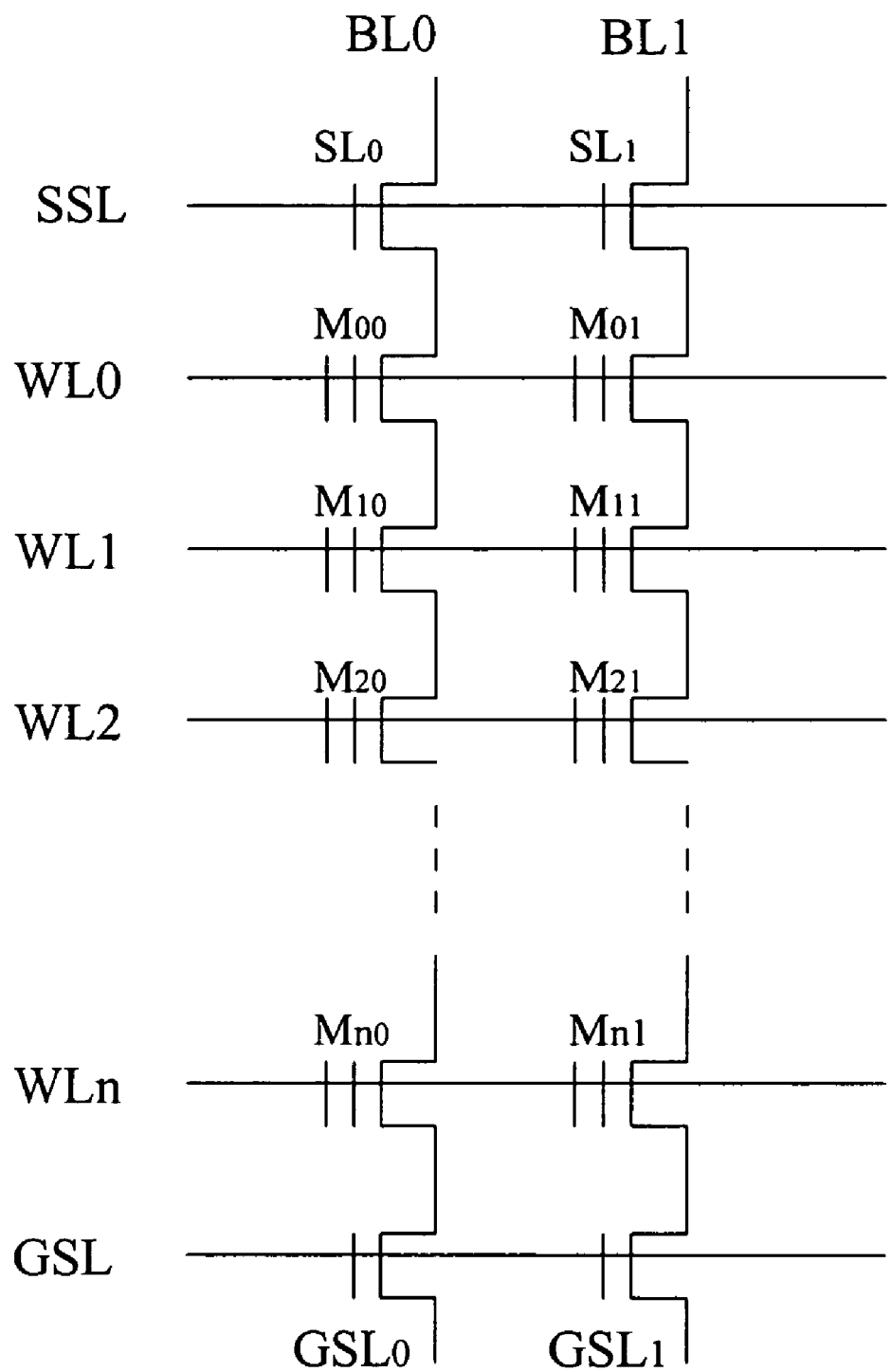
FIG. 1 is circuit diagram of a portion of a flash memory having a plurality of NAND memory cells.

Referring to FIG. 1, an electrically erasable programmable read-only memory is shown comprising an array of memory cells, which is formed on a chip substrate. As will be recognized by those in the art, FIG. 1 is a circuit diagram of a portion of an NAND flash memory array. Various components, such as column and row decoders, sense circuitry and other control circuitry are not shown so as to avoid obscuring the disclosure of the present invention. These components, however, are familiar to those in the art.

The memory array includes a plurality of parallel bit lines BL0, BL1, . . . BLm coupled to memory cells $M_{nm}$, where "n" represents the row number and "m" represents the column number of the cell location in the memory array. Parallel word lines WL0, WL1, WL2 . . . WLn are insulatingly formed over the substrate so as to form control gates for the flash memory cells $M_{nm}$ formed at each cell location. Selection transistors SL0, SL1, etc. and GSL0, GSL1, etc. are formed at respective ends of bit lines BL.

An exemplary memory array is partitioned into many memory "blocks." Each block has several "pages." A page has many memory "cells." For example, a 1 Gb memory has 1024 blocks, and one block has 64 pages. Each page has 2K bytes of bits (i.e., 16K bits). A word line contains a page or multiple pages. A cell string or two cell strings are provided per block in the bit line direction. A cell string has 16 bits, 32 bits or 64 bits. A cell stores a single bit per cell or two bits per cell, as is the case with SONOS memory cells discussed below.

In one embodiment, program, erase and read operating conditions are as follows:

|  | Erase | Program | Read |
|---|---|---|---|
| Selected WL | 0 V | 20 V | 0 V |
| Pass (de-selected) WL | 0 V | 10 V | 4.5 V |
| SSL | floating | VCC | 4.5 V |
| GSL | floating | 0 V | 4.5 V |
| BL (program 0) | floating | 0 V | N/A |
| BL (program 1) | floating | VCC | N/A |
| Bulk | 20 V | 0 V | N/A |

In this program/erase methodology, Fowler-Nordheim (FN) tunneling is used for programming and erasing of the NMOS NAND flash cells. During programming, a high positive voltage is applied on the selected cell word line. A medium voltage is applied on the de-selected word line to turn on these cells. Ground or 0V is applied to the bit line for writing data "0" and VCC is applied for writing data "1". The 0V is transported to the channel of the selected cell and FN tunneling is performed to inject electrons from the channel to the floating gate. When the data is "1", the channel is coupled up by the word line voltage and there is negligible FN tunneling current; thus the cell is not programmed. For erasing, the P-well of the cell is biased at a high voltage and all word lines in a selected block are grounded. Electrons FN tunnel from the floating gate to the P-well substrate.

Figure 2:
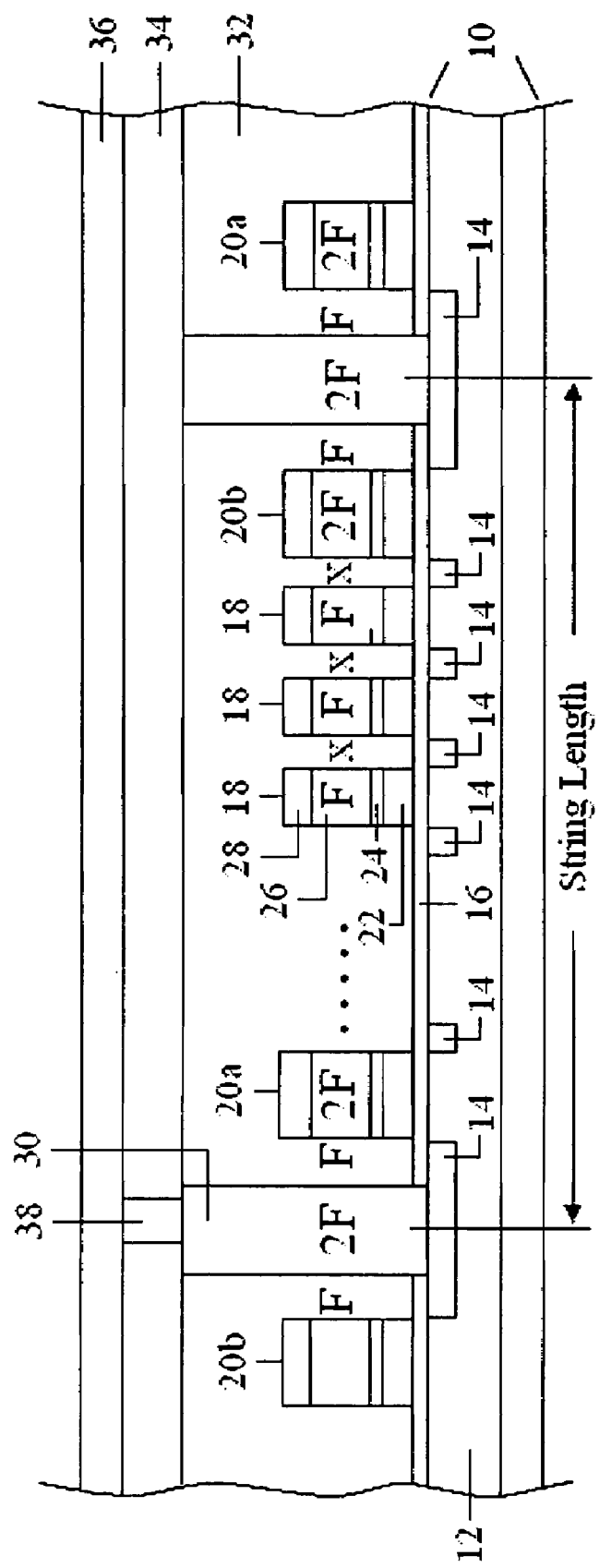
FIG. 2 is a cross-sectional view of the cell string from an exemplary memory device showing the word line spacing thereof.

FIG. 2 is a side cross-sectional view showing a cell string. The string includes selection transistors 20a, 20b with a plurality of NMOS floating gate flash cell transistors 18 formed therebetween. Although selection transistors 20a, 20b are shown as dual gate transistors, single gate transistors may also be used as shown in FIG. 1.

In one embodiment, the substrate 10 comprises a p-doped silicon substrate having a triple well region 12 formed in the cell array region therein. The triple well includes an n-well surrounding a p-well. Alternative embodiments may utilize n-doped substrates and alternative well arrangements, for example. Although described herein in connection with NMOS flash cells, the memory cells may also comprise PMOS cells formed over a p-type substrate. A gate dielectric layer 16 is thermally grown over the substrate 10, and preferably comprises $SiO_2$ formed to a thickness of between about 70-110 Å. Source/drain implant regions, preferably N+ implant regions 14 are formed between the cells 18 and between the cells and selection transistors 20a, 20b. In one embodiment, the N+ regions comprise arsenic or phosphorous dopants at a concentration of about $1\times10^{18}$ to $5\times10^{19}$ atoms/$cm^3$.

Each cell 18 comprises a conductive floating gate 22 formed over the gate dielectric layer 16, preferably comprising a polysilicon layer having a thickness between about 300-1000 Å, and more preferably about 500 Å. A dielectric layer 24 is formed over the floating gate 22 and comprises a thermal oxide layer, such $SiO_2$ formed to a thickness of about 110-140 Å, or an ONO (oxide/nitride/oxide) layer having an effective oxide thickness between about 110-140 Å. The ONO layer may be deposited using an LPCVD (low pressure chemical vapor deposition) process, with the top oxide layer having a thickness of about 20 Å deposited from $SiH_2CL_2/O_2$ gas, the bottom oxide layer having a thickness of about 40 Å deposited from $SiH_2CL_2/O_2$ gas and the SiN layer having a thickness of about 80 Å deposited from $SiH_2CL_2/N_2$ gas. A control gate 26, which is formed from a word line shared by several parallel cell strings, is formed over the dielectric layer 24 and preferably comprises a polysilicon layer 28 having a thickness of between about 700-1000 Å. A silicide layer 28, preferably comprising a tungsten (W) silicide layer, optionally may be formed over the control gate/word line 26.

A planarizing insulation layer 32, which can comprise one or more individual dielectric layers, is formed over the cell string. Connection holes are formed through the dielectric layer 32 and filled with polysilicon plugs 30 for making electrical connections to the selection transistors 20. Conductive bit line 36, which may comprise tungsten (W), for example, is formed over second insulation layer 34 and coupled to the polysilicon plug 30 through conductive via 38.

It should be apparent to those in the art that while the control gates 26 (and silicide layer 28 when present) form word lines that traverse several cell strings as shown in FIG. 1, the floating gates 22 and dielectric layer 24 of each cell are surrounded by an insulation layer that separates the cells of individual strings from each other as well as from the cells of adjacent strings.

As shown in FIG. 2, each transistor cell 18 has a channel length of F, defined by the minimum dimension which can be imaged by a photolithography process used in forming the features of the memory array. Each selection transistor 20 preferably has a length of 2F (to avoid punch-through issues, minimize source-to-drain leakage current, etc.) and is spaced from a respective plug 30 by a distance F. Each plug has a pitch of 2F. Importantly, each floating gate cell 18 is spaced from an adjacent floating gate cell 18, and from an adjacent selection transistor 20 (for the endmost cells 18) a distance "X" that is less than "F". The total string length is equal to 8F+mF+(m+1)X, where "m" is the total number of cells in the string, typically 16, 32 or 64. In an embodiment where X equals 0.03 μm and F equals 0.09 μm, and there are 16 cells, the total string length is only 24F+(17/3)F=29.7F. The total string length would be 41F if X were equal to F, such as in the prior art. Further, the cell size is around (F+X)2F (or about ($2.66F^2$)) rather than $4\text{-}5F^2$, again assuming X equals 1/3F.

An exemplary method of forming the closely spaced word line structure of FIG. 2 is described with reference to FIGS. 3A-3F. FIGS. 3A-3F illustrate the front-end-of-line (FEOL) process steps for creating the memory structure. The process steps for forming the interconnect circuitry, i.e., the back-end-of-line (BEOL) processing for forming features such as contacts, vias, metal lines and corresponding insulation layers, needed to address the individual memory cells are not discussed.

Figure 3A:
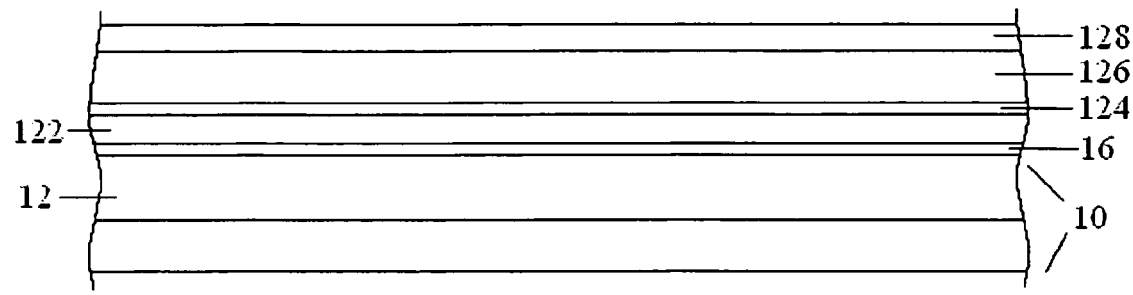
FIGS. 3A-3F illustrate an exemplary method of fabricating the structure of FIG. 2.

With reference to FIG. 3A, a stack of materials for forming the individual memory cell transistors is first formed over the gate dielectric layer 16. Specifically, a floating gate polysilicon layer 122 is deposited to a thickness between about 300-1000 Å. Next, ONO dielectric layer 124 is formed over the polysilicon layer 122. Then, control gate polysilicon layer 126 is deposited to a thickness of between about 700-1000 Å. Last, a tungsten silicide layer 128 is deposited or otherwise formed over the control gate polysilicon layer 126 to a thickness of about 300 Å.

Figure 3B:
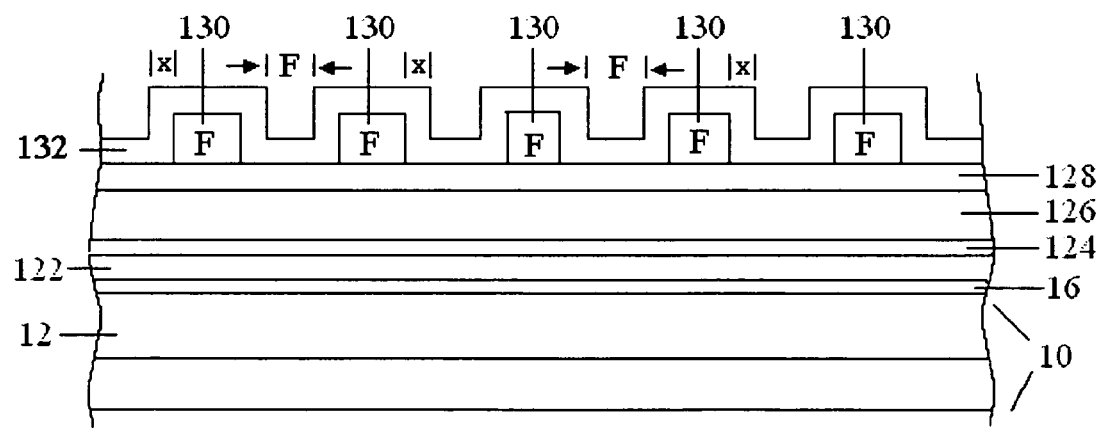

With reference to FIG. 3B, a first oxide layer is deposited or formed over the silicide memory cell stack (i.e., layers 122, 124, 126, 128) and patterned and etched to form a first group of oxide masks 130 that are spaced to define a first group of spaced word lines and memory cells. In one embodiment, the oxide masks have a thickness of between about 900-1500 Å, and more preferably of about 1000 Å. The oxide masks 130 are formed from an oxide layer that is patterned and etched using a photoresist mask imaged with a photolithography process where "F" is the minimum dimension which can be imaged. Each mask 130 has a width of F. A SiN layer 132 is then deposited over the structure, i.e., over the oxide masks 130 and silicide layer 128. SiN layer 132 is deposited to a thickness of less than F, and in one embodiment to about 300 Å, such as by a low pressure chemical vapor deposition (LPCVD) process. In embodiments, the oxide masks 130 area spaced from one another a distance of F+2X, where X is the distance between word lines shown in FIG. 2. This distance is certainly definable by a photolithography process that can define feature sizes as small as F.

Figure 3C:
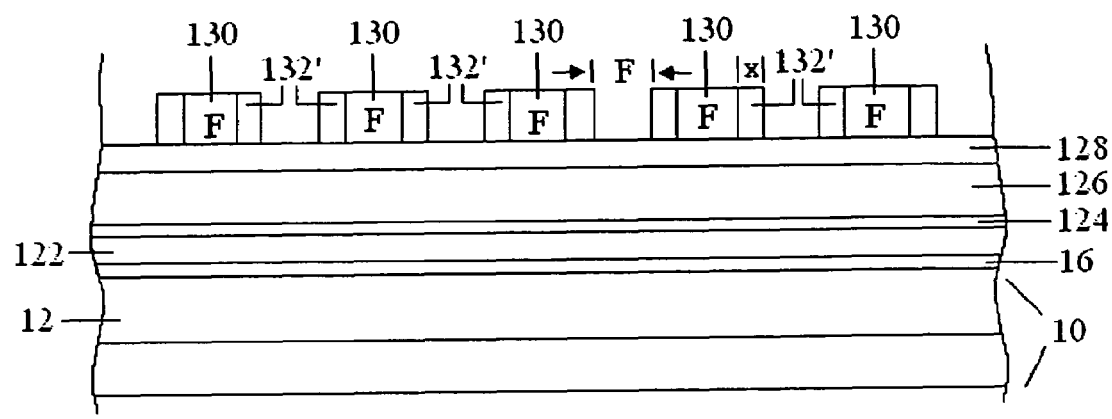

With reference to FIG. 3C, portions of SiN layer 132 are removed to leave SiN side spacers 132' on the sidewalls of the oxide masks 130. Endpoint detection can be used to monitor the etch process. In an exemplary embodiment, an anisotropic dry etch process using a Ar/CF$_4$ reaction gas may be used in etching SiN layer 132. The etching process is stopped when the oxide layer 130 is detected. Because the oxide is thicker than the SiN formed therebetween, only the portions of the SiN layer 132 adjacent the oxide sections remain once the oxide is detected. The SiN spacers 132' have a thickness that is equal to "X", the desired spacing between the word lines, which is roughly the same as the deposited thickness of layer 132.

Figure 3D:
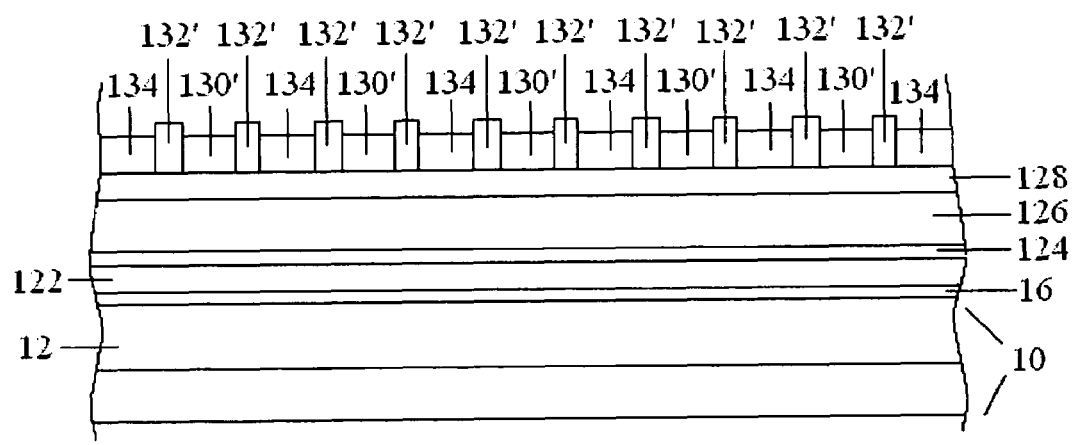

With reference to FIG. 3D, a second oxide layer (not shown) is then deposited over the structure of FIG. 3C, filling the open spaces between spacers 132', and is etched back to leave a second group of spaced oxide masks 134. Oxide masks 130 remain but are designated 130', as they may be slightly etched during exposure of spacers 132' through the second oxide layer. Each oxide section 130', 134 has a width equal to F and is spaced from an adjacent oxide section by a spacer 132' that has a width equal to X, which is smaller than F. Collectively, layers 130' and 134 form an oxide mask for forming spaced word lines and memory cells. Although only 11 oxide mask sections are shown, it should be understood that 16, 32 or 64 sections are provided for forming the desired number of word lines in a string, as well as additional oxide sections for forming the selection transistors (not shown).

In alternative embodiments, masks 130, 134 are formed from SiN and layer 132, and thus spacers 132', are formed from an oxide.

Figure 3E:
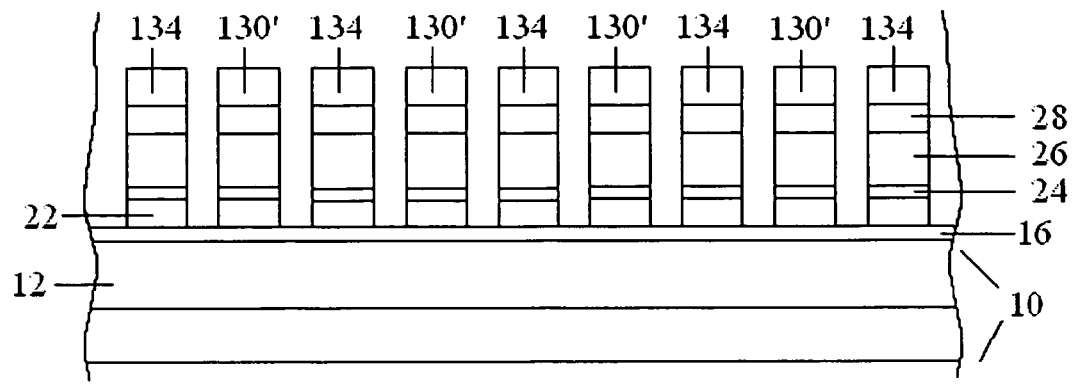

With reference to FIG. 3E, the SiN spacers 132' are removed, and the oxide mask layer of FIG. 3D is used to etch through layers 122, 124, 126 and 128, leaving layers 22, 24, 26 and 28, to form the spaced memory cells 18 of FIG. 2 having widths F and being separated a distance X. The SiN spacers 132' can be removed using a dry etch process using an Ar/CF$_4$ reaction solution. The control gate polysilicon layer 126 can be etched with a dry etch process using a Cl$_2$/HBr solution. The same solution can be utilized in etching silicide layer 128. The ONO dielectric layer 124 can be etched with a dry etch process using a CHF$_3$/CHF$_4$/He solution. Finally, the floating gate polysilicon layer 122 can be etched using a dry etch process using a Cl$_2$/HBr solution.

Figure 3F:
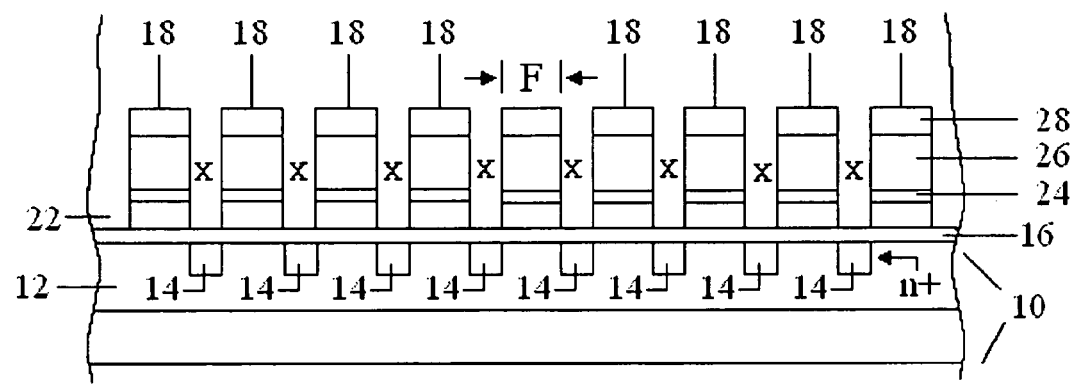

As shown in FIG. 3F, mask sections 130' and 134 are removed, such as in an etch process, and implant regions 14 are formed in the substrate 10 adjacent to and in between the individual memory cells 18.

An alternative programming/erasing methodology also may be utilized for the memory cell array of FIG. 1 that utilizes hot hole injection by BTBT (band-to-band-tunneling) to remove stored electrons during programming. Tunneling happens at the intersection of the source/drain (S/D) junction and the tunnel oxide. The n+ S/D to substrate junction is reverse biased to a degree such that soft breakdown or Zener breakdown happens. The pn junction has current flow as electrons tunnel from the valence band to the conduction band in the S/D and at the intersection. Holes generate in the valence band, and the floating gate attracts the holes by applying a negative voltage on control gate. The negative voltage on the control gate also enhances this BTBT current. If the accessed cell is not programmed, the bit line is biased at 0V and the S/D junction is not reverse-biased. There is no BTBT tunneling current under this condition. Erasing is performed by making all of the cells in a selected block have a higher threshold. During erase, electrons tunnel from the channel to the floating gate by FN tunneling. The program, erase and read conditions are summarized in the following table.

|  | Erase | Program | Read |
|---|---|---|---|
| Selected WL | 20 V | −5 V | 0 V |
| Pass WL | 20 V | 10 V | 4.5 V |
| SSL | VCC | 10 V | 4.5 V |
| GSL | 0 V | floating | 4.5 V |
| BL (program 0) | 0 V | 7 V | N/A |
| BL (program 1) | 0 V | 0 V | N/A |
| Bulk | 0 V | 0 V | N/A |

Hot hole injection generates holes trapped in the tunnel oxide and can degrade program-erase endurance characteristics. The hole traps locate near the drain junction edge, which affects the injection of the channel hot electrons for programming. The existing hole traps will lower the electrical field near the drain and make hot electron efficiency poor. The impact of this mechanism in the programming method suggested above is low, however, since the erasure is accomplished by FN tunneling for the whole tunnel oxide area. While this mechanism may induce disturbances in NOR flash memories, it does not do so in NAND flash memories. The de-selected word line has a high voltage to pass the bit line voltage. The cells on the de-selected word line have no BTBT disturb. The de-selected block also has a selection transistor that protects the cells. The bit line voltage cannot be transported to the cells. To be sure, the S/D junction is reverse biased, so the S/D needs a positive bias. This bias comes from the bit line. Assume for example that WL2 is selected and a cell is to be programmed. WL0 and WL1 are the de-selected word lines between the selected word line and the bit line. WL0, WL1 and SSL are pulled to 10V. WL2 is set to −5V. The 7V bias on the bit line will pass to the S/D region between WL1 and WL2. This S/D region will have BTBT tunneling current. The negative biased WL2 will attract holes to the floating gate of this cell. Since WL2 is negatively biased and this bias is below the Vth of the erased state, the cell is off. Therefore, the 7V cannot pass to WL3 and the other word lines.

FIGS. 4A-4D illustrate that the process described above in connection with FIGS. 3A-3F is applicable to the formation of SONOS (silicon/ONO/silicon) memory cells described in, for example, U.S. Pat. No. 6,580,120 to Haspeslagh, the entirety of which is hereby incorporated by reference herein. Like references from FIGS. 3A-3F refer to like features in FIGS. 4A-4D.

Figure 4A:
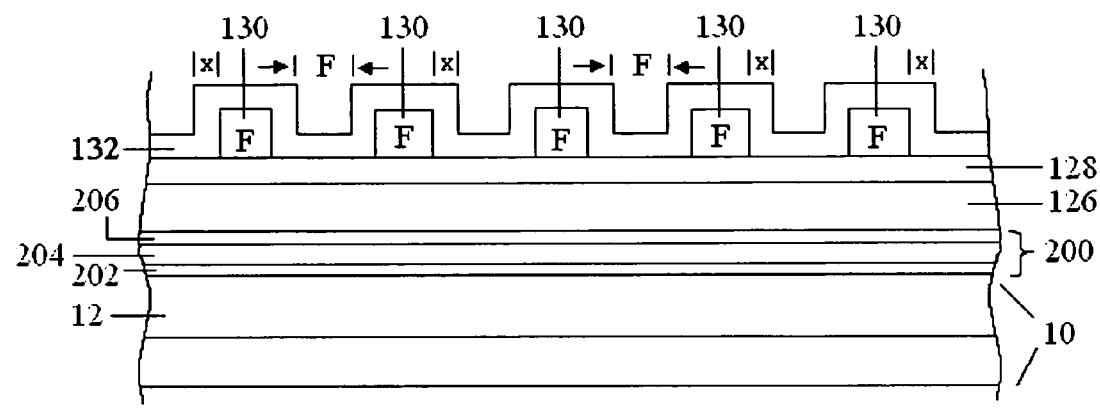
FIGS. 4A-4D illustrate steps in fabricating a SONOS memory cell structure.

As shown in FIG. 4A, an ONO layer 200 is formed over the substrate 10. The ONO layer 200 preferably has an effective oxide thickness of between about 110-140 Å. The layer 200 comprises a first insulation layer 202, a storage layer 204 and a second insulation layer 206. The ONO layer may be deposited using an LPCVD (low pressure chemical vapor deposition) process, with the top oxide layer 206 having a thickness of about 20 Å deposited from SiH$_2$CL$_2$/O$_2$ gas, the bottom oxide layer 202 a thickness of about 40 Å deposited from SiH$_2$CL$_2$/O$_2$ gas and the SiN storage layer 204 having a thickness of about 80 Å deposited from SiH$_2$CL$_2$/N$_2$ gas.

The remainder of the process is essentially the same as described above in connection with FIGS. 3A-3F. A control gate polysilicon layer 126 is formed over layer 200. Silicide layer 128 optionally is formed, followed by formation of the first group of spaced oxide masks 130 and SiN layer 132.

Figure 4B:
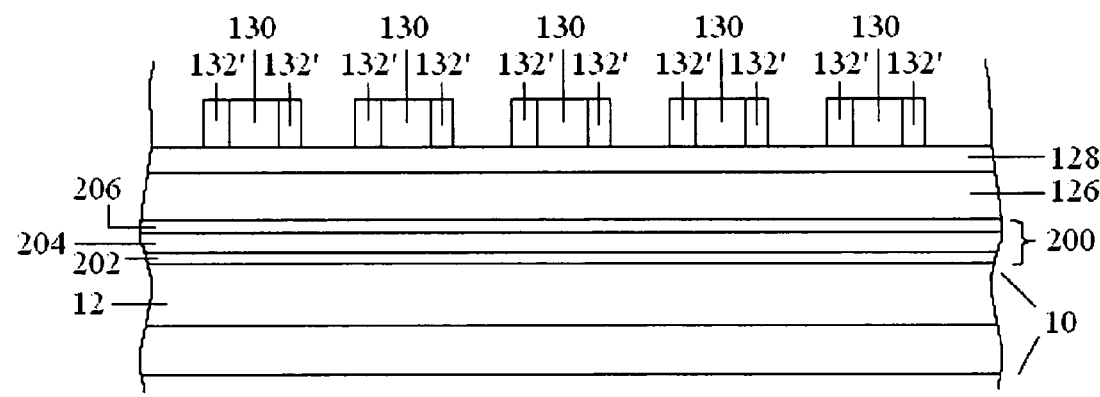
Figure 4C:
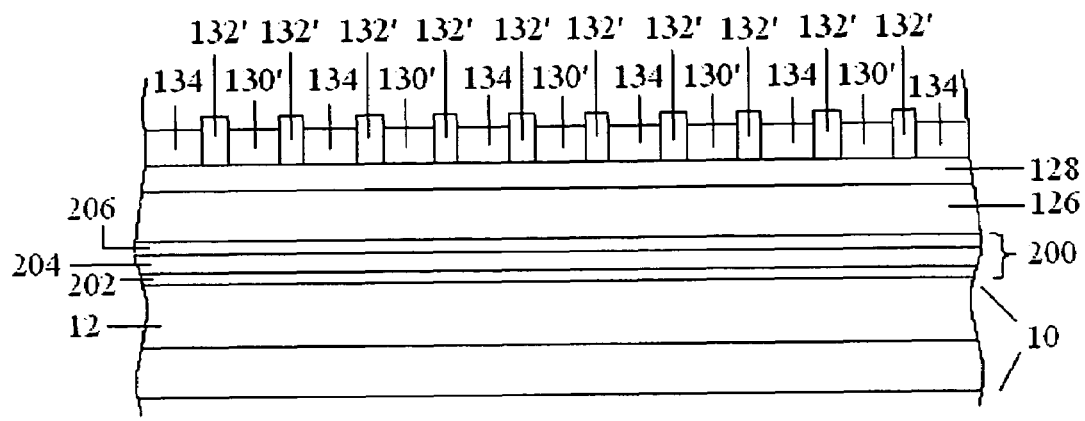
Figure 4D:
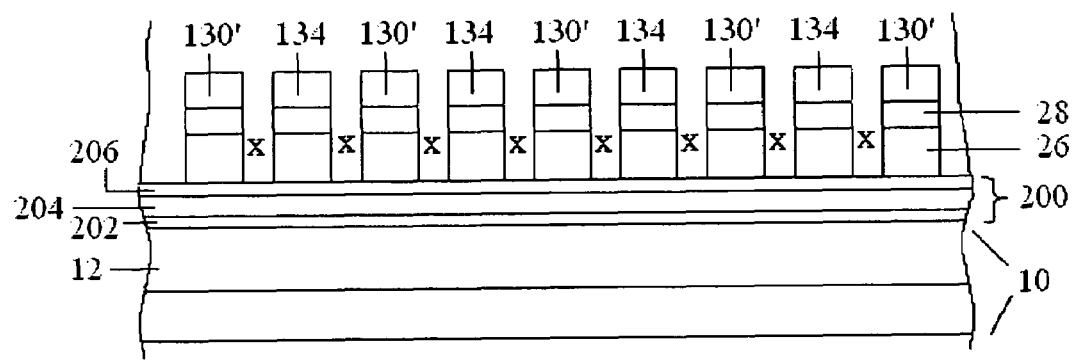

With reference to FIG. 4B, the SiN layer 132 is etched to form SiN spacers 132'. In FIG. 4C, a second oxide layer is deposited and etched to expose SiN spacers 132', leaving second group of spaced oxide masks 134. As shown in FIG. 4D, the SiN spacers 132' are removed and the mask groups are then utilized in etching through the silicide layer 128 and top polysilicon layer 126.

In embodiments, FIG. 4D represents the final cell structure, although mask sections 130' and 134, which are shown, are removed. In alternative embodiments, the etch process continues through ONO layer 200 to the substrate 10. In this alternative embodiment, implant regions are formed (as shown above in FIG. 3F and FN tunneling is used to do the programming/erasing. The program/erase/read conditions for the implant embodiment are shown in the table below for NMOS cells.

|  | Erase | Program | Read |
|---|---|---|---|
| Selected WL | 0 V | 12-15 V | 0 V |
| Pass (de-selected) WL | 0 V | 6-9 V | 4.5 V |
| SSL | floating | 6-9 V | 4.5 V |
| GSL | floating | 0 V | 4.5 V |
| BL (program 0) | floating | 0 V | N/A |
| BL (program 1) | floating | 6-9 V | N/A |
| Bulk | 12-15 V | 0 V | N/A |

If there is no implant region, source side injection is used to do programming and FN tunneling is used for erasure. This programming/erasing method is described in U.S. Pat. No. 6,580,120, the entirety of which is hereby incorporated by reference herein. An exemplary reading condition is also described in the '120 patent.

From the foregoing, a method of forming word lines, and thus cells, having reduced spacing is provided with an integration friendly process. Reduced cell spacing improves integration density, thereby reducing device size and/or capacity.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. A method of forming a NAND Flash memory device comprising the following steps:
   forming a control gate polysilicon layer over a substrate;
   forming a mask layer over said control gate polysilicon layer, said mask layer including a mask pattern defining a plurality of spaced word lines of said NAND Flash memory device, said word lines being spaced from each other a distance less than a minimum feature size associated with a selected photolithography process used in forming at least a portion of said mask pattern; and
   etching said control gate polysilicon layer through the mask layer, thereby forming said plurality of spaced word lines from said control gate polysilicon layer.

2. The method of claim 1, wherein said mask layer formation step comprises the following steps:
   forming a first layer over said control gate polysilicon layer and patterning said first layer using said photolithography process to form a first group of spaced mask sections defining a first group of spaced word lines;
   forming spacers on side edges of said first group of spaced mask sections;
   forming a second layer between said spacers, said second layer defining a second group of spaced word lines; and
   removing said spacers, thereby forming said mask pattern defining said plurality of spaced word lines.

3. The method of claim 2, wherein said spacers comprise SiN and said first and second layers comprise an oxide, or said first and second layers comprise SiN and said spacers comprise an oxide.

4. The method of claim 3, wherein said spacer forming step comprises the step of depositing a spacer layer over said first layer and in between said first group of spaced mask sections, and etching said spacer layer from over said first layer and between said first group of spaced mask sections to form said spacers.

5. The method of claim 2, said second layer forming step comprises the step of depositing said second layer over said substrate, including over said first layer and said spacers, and etching said second layer to expose said spacers.

6. The method of claim 5, wherein said first layer has a thickness of about 1000 Å and said spacers have a thickness of about 300 Å.

7. The method of claim 1, further comprising the step of after said etching step, forming implant regions in said substrate between said spaced word lines.

8. The method of claim 1, wherein said control gate polysilicon layer is formed over an ONO layer.

9. The method of claim 7, wherein said ONO layer has an effective oxide thickness between about 110-140 Å.

10. The method of claim 1, further comprising the step of forming a silicide layer over said control gate polysilicon layer.

11. The method of claim 1, further comprising the steps of:
   forming a floating gate polysilicon layer over an active area in said substrate; and
   forming a dielectric layer over said floating gate polysilicon layer, wherein said etching step comprises the steps of etching said floating gate polysilicon layer and said dielectric layer.

12. The method of claim 1, further comprising the steps of:
   forming a first insulator layer on said substrate;
   forming a storage layer over said first insulator layer;
   forming a second insulator layer over said storage layer, wherein said control gate polysilicon layer is formed over said second insulator layer.

13. The method of claim 1, wherein said mask layer comprises an oxide.

14. A method of forming a NAND flash memory device, comprising the following steps:
   forming a dielectric layer over a substrate;
   forming a polysilicon control gate layer over said dielectric layer;
   depositing a first mask layer over said polysilicon gate layer;
   etching said first mask layer to form a first group of spaced mask sections defining a first group of spaced word lines, each mask section having a width dependent on a minimum feature size associated with a selected photolithography process, adjacent mask sections being spaced a distance greater than said minimum feature size and less than twice said minimum feature size;
   forming a second group of spaced mask sections defining a second group of spaced word lines, individual ones of said second group of spaced mask sections being disposed between adjacent mask sections from said first group of spaced mask sections, wherein individual ones of said second group of spaced mask sections are disposed a distance less than said minimum feature size from an adjacent mask section from said first group of spaced mask sections; and etching said polysilicon control gate layer though said first and second groups of spaced mask sections.

15. The method of claim 14, further comprising the steps of:

forming a sacrificial layer over said first group of spaced mask sections;

etching said sacrificial layer to form spacers on sidewalls of said first group of spaced mask sections;

forming a layer of mask material over said first group of spaced mask sections and spacers;

etching said layer of mask material to expose said first group of spaced mask sections, wherein portions of said mask material layer remain to form said second group of spaced mask sections; and removing said spacers.

16. The method of claim 14, wherein said first and second group of spaced mask sections comprise an oxide or SiN.

17. The method of claim 14, wherein said dielectric layer comprises an ONO layer.

18. The method of claim 17, wherein said ONO layer is formed on said substrate, said method further comprising the step of removing said mask sections, wherein said ONO layer remains substantially unetched.

19. The method of claim 17, wherein said dielectric layer is formed over a floating gate polysilicon layer, said etching step further comprising etching said dielectric layer and floating gate polysilicon layer through said first and second groups of spaced mask sections.

20. A method of forming a NAND Flash memory device comprising the following steps:

forming a control gate polysilicon layer over a substrate;

forming a mask layer over said control gate polysilicon layer, said mask layer including a plurality of spaced mask sections defining a plurality of spaced word lines of said NANID Flash memory device, each svaced mask section having a defined width, wherein individual ones of said mask sections are spaced from adjacent mask sections a distance less than said defined width; and etching said control gate polysilicon layer through said mask layer, thereby forming said plurality of spaced word lines from said control gate polysilicon layer.

21. The method of claim 20, wherein said mask layer comprises an oxide or SiN.

22. The method of claim 21, further comprising the step of forming an ONO layer on said substrate and said control gate polysilicon layer on said ONO layer.

* * * * *